United States Patent [19]
Yamasaki

[11] Patent Number: 5,517,146
[45] Date of Patent: May 14, 1996

[54] WRITE PRECOMPENSATION CIRCUIT FOR COMPENSATING NONLINEAR MAGNETIC EFFECTS IN A RECORDING CHANNEL

[75] Inventor: Richard Yamasaki, Torrance, Calif.

[73] Assignee: Silicon Systems, Inc., Tustin, Calif.

[21] Appl. No.: 229,354

[22] Filed: Apr. 18, 1994

[51] Int. Cl.[6] ..................................... H03H 11/26
[52] U.S. Cl. ............................ 327/276; 327/261
[58] Field of Search .................... 307/494, 601,
307/603, 608; 327/2, 3, 5, 7, 8, 10, 13,
14, 15, 16, 17, 24, 26, 63, 65, 113, 114,
172, 173, 174, 261, 263, 264, 269, 270,
272, 276, 278, 283, 561, 563; 360/45, 46

[56] References Cited

U.S. PATENT DOCUMENTS 5,047,667  9/1991  Howie ........................................ 327/63

Primary Examiner—Timothy P. Callahan
Assistant Examiner—Jeffrey Zweizig

Attorney, Agent, or Firm—Hecker & Harriman

[57] ABSTRACT

In accordance with the invention, a system which compensates nonlinear bit shift is provided for a high-rate constant density recording device. The invention's apparatus generates a programmable write precompensation delay that is an accurate percentage of the write current time period, allowing for variations of the write current time period with the track radius. The apparatus utilizes the output tinning signal from a Voltage Controlled Oscillator VCO to generate write precompensation delay that is an accurate percentage of the VCO output timing signal period, equal to the write current time period. Differential ramp voltage signal, also generated in the VCO, is compared to the late threshold voltage regulated by two internal resistors. Trailing edge of the delayed write signal, created at the comparator's output, is varied with the change in late threshold voltage. Frequency of the VCO's output timing signal is varied for different tracks. Since the frequency of the VCO is phase locked to the write current frequency, then the choice of the two internal resistors adjusts the precompensation delay period as a continuous percentage of the write current time period.

17 Claims, 8 Drawing Sheets

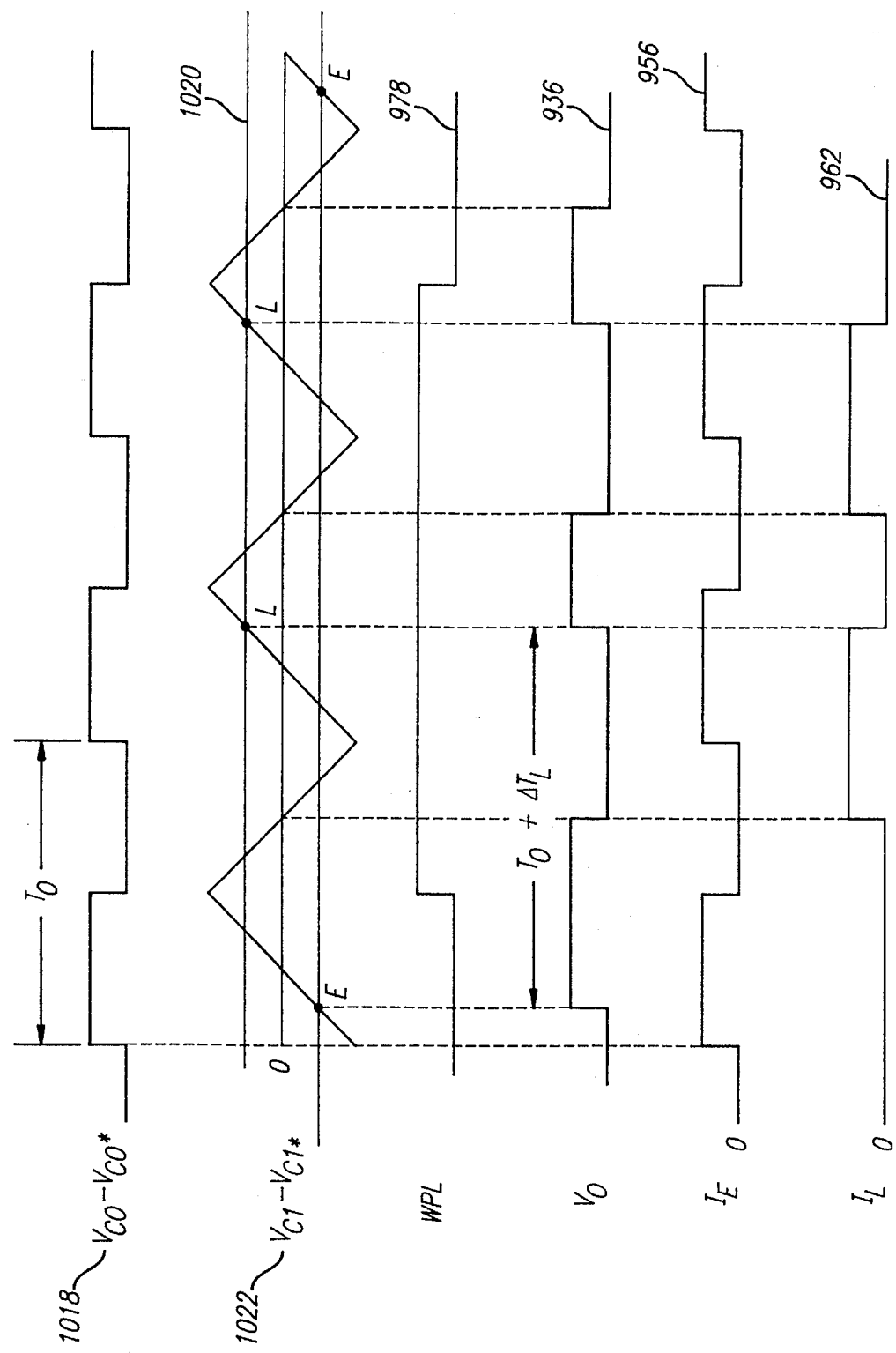

WRITE PRECOMPENSATION CIRCUIT FOR COMPENSATING NONLINEAR MAGNETIC EFFECTS IN A RECORDING CHANNEL

BACKGROUND OF THE INVENTION

1. Field of the Invention

This invention relates to the field of integrated circuitry for writing data to a magnetic medium, and more particularly, to techniques for generating a precompensation delay in the path of the write data stream.

2. Background Art

In computer systems, information is stored on magnetic storage systems such as Winchester type hard disks or floppy disks. Data is stored in a series of spiral or concentric rings known as "tracks". The data consists of streams of transitions of polarity of magnetic particles on the disk surface. A number of schemes are used to detect these transitions and data.

One prior art data detection method is a peak detection system. A disadvantage of peak detection schemes is limited data density. Another prior art data detection scheme is known as partial-response class IV (PR-IV) signaling. Systems using PR-IV schemes can achieve higher recording density than the conventional peak detection systems.

A PRML (partial response maximum likelihood) channel can be used to achieve high data density in writing and reading digital data on the disks. PRML coding assumes a linear channel. However, the recording characteristics of a magnetic medium such as a disk are nonlinear due to intersymbol interference (ISI). Nonlinear distortion in the recording process leads to degradation at higher densities and data rates. Narrow pulses in certain patterns of digital data signals experience pulse compression and other nonlinear pulse-edge displacement effects when stored magnetically on a disk file. The resulting data read back from the disk has a higher error rate because the nonlinear edge timing shifts reduce the timing margin for error of the data detection system. If the pattern-dependent edge shifts can be ascertained for the particular medium, then it is possible to preshift the write data pulse edges by an amount equal and opposite to the direction in which the medium will shift them. As a result, data with the correct timing relationships is read back from the disk. Timing precompensation decreases error rates and increases disk file capacity. Particular algorithms for determining which pulse edges to shift are well known, and are not described in detail. The amount of capacity improvement obtainable for any algorithm depends upon the accuracy of the time shifts delivered by the precompensation circuit.

The present invention relates to high-density magnetic recording of digital data, and more specifically concerns electronic circuits and methods for producing very accurate timing variations in the clocking of high-speed write data to be recorded upon magnetic media, so as to compensate for nonlinear properties of the media. It is designed for disk drives employing a method of recording termed constant density recording where the data is written in each track (or in a zone of tracks) so that the signal density is constant across all tracks in a zone. As a result, the frequency of recording of such data in outer radius tracks is higher than the frequency of recording in the inner tracks. In constant density recording the write current time period defines the recorded data length (which also varies with the track radius) so that, ideally, each pulse, when recorded, has the same length.

The prior art has employed two techniques to implement constant density recording. The first method varies the rotational speed of the disk and senses data at a constant data rate. The second technique maintains the rotational speed of the disk constant, while increasing the recording rate as tracks approach the outer edge of a disk. The first method has been used in floppy disk drives. In hard disk drives it is difficult to vary the disk rotation speed and they typically use different recording rates for different zones of tracks, depending upon the location of the track on the disk.

One conventional technique for obtaining time shifts and delays for this purpose is to use RC or other analog timing circuits. This technique is severely limited by component tolerances and environmental factors such as temperature. Another technique relies upon propagation delays of logic gates to determine time intervals of pulse edge shifts. However, logic-gate delays are inherently highly variable with environmental factors and process variations. A third method is to synchronize all signals to a compensation clock operating at a frequency high enough to allow all precompensation intervals to be specified in integral numbers of cycles of the compensation clock. A write precompensation modulation waveform of the simplest algorithm is shown in FIG. 1. The trailing edge 101 is shifted by an amount delta L, due to the interaction of neighboring bits.

One recent application is described in a paper by Philpott, Kertis, Richefta, Schmerbeck and Schulte entitled "A 7 MB/Sec (65 MHz), Mixed Signal, Magnetic Recording Channel DSP Using Partial Response Signalling with Maximum Likelihood Detection", 1993 IEEE Custom Integrated Circuits Conference, pp. 10.4.1–10.4.4. The schematic of the circuit employed in this technique is illustrated in FIGS. 2 and 3. According to FIG. 2, a combined data and clock signal 201 enters two different delay blocks 203 and 205. The first block 203, named Fixed Delay, compensates for the nonlinearities in the circuit. Precompensation delay block 205, named Variable Delay Circuit, delays the signal in time with respect to the first block 203, when the precompensation select bit 207 in a multiplexer 209 enables precompensation delay mode. The output signal 211 at node C has a delay that is the difference between the two block delays. Thus, this application requires two delay elements and requires that they are accurately matched.

Further, as seen in FIG. 3, the delay is not matched to the write current time period and is not an accurate percentage of the write current time period. According to FIG. 3, showing a detailed schematic of the Variable Delay Circuit from FIG. 2, a differential signal enters the circuit at pins MIN 301 and PIN 303, and is amplified with an NPN differential amplifier 305. Emitter-followed outputs from the differential amplifier 305 drive the capacitors 307 and 309 at pins I0 311 and I1 313. The voltage on the capacitors 307 and 309 is monitored by two Schmidt trigger circuits 315 and 317 that share common outputs 319 and 321. The variable delay is achieved by changing the discharge rate of the capacitors 307 and 309, affected by sinking a current from pins I0 311 and I1 313. This current is controlled by a 5-bit DAC, shown in FIG. 2. Only one Schmidt trigger is powered on at a time to toggle the output and the selection is accomplished by a PNP differential pair 323, connected to the input signal at nodes MIN 301 and PIN 303. The design has drawbacks and limitations which limit its effectiveness.

In prior art approaches, phase locked loops have been employed to provide for timing control. A prior approach followed by IBM has been described in several articles including Coker et al., "Implementation of PRML in a Rigid Disk Drive", IEEE Trans, on Magnetics, Vol. 27, No. 6, November 1991, pp 4538–4543; and Cideciyan et al, "A PRML System for Digital Magnetic Recording", IEEE Journal on Selected Areas in Communications, Vol. 10, No. 1, January 1992, pp 38–56. The IBM technique does not permit easy adjustment of the delay period to compensate for nonlinear distortion as the write head changes tracks on the disk nor can the technique be used with constant density recording which requires the delay period to change dynamically as a function of the bit rate.

Another prior art circuit is shown in FIG. 4. A sawtooth ramp circuit is formed by a reset transistor 401, capacitor 403 and a programmable current source 405. A programmable threshold VT 407 is set by resistor 409 and a programmable current 411. A comparator 413 is used to detect the moment when the ramp voltage VR 415 crosses VT 407. The trailing edge delay of the output signal VO 419 is varied by varying VT 407. The circuits waveforms are presented in FIG. 5. The threshold VT 407 is set to VTO 501. When a trailing edge delay of the output signal VO 419 is desired, the threshold is lowered to VTL 503. This technique is difficult to use with constant density recording (which requires the delay period to change dynamically as a function of the bit rate) since the delay element is not matched to the timing circuit. Moreover, when a large amount of delay is required, the comparator's output pulse becomes too narrow and difficult to use.

SUMMARY OF THE INVENTION

The present invention comprises a Write Precompensation Delay Generator circuit for high-speed constant density recording, having a write precompensation threshold generator for producing a threshold voltage, a voltage control generator for producing write current time period and differential ramp voltage for write precompensation threshold generator, and a comparator to detect differential ramp voltage crossing the threshold voltage, for generating a write precompensation delay as a constant percentage of the write current time period, regardless of variation in said write current time period.

In the preferred embodiment, the write precompensation threshold generator and the voltage control generator are controlled by the same input signal. The write precompensation threshold generator comprises an early threshold circuit coupled in series with a late threshold circuit, to generate the write precompensation delay.

The early and late threshold circuits include a pair of resistors fabricated on the same chip. The write precompensation delay depends substantially upon a ratio between the resistors of that pair. The write precompensation delay, influenced by the early and late threshold circuits, depends substantially upon the differential ramp voltage, as well.

In the circuit of the preferred embodiment, the late threshold circuit is activated in response to a write precompensation late enabling signal.

The present invention provides apparatus for generating a precompensation delay in the path of a data signal, in constant density recording, the delay having a duration which is an adjustable and accurate percentage of the write current time period, which varies with the track radii.

The present invention also provides a circuit which may be used to generate a precompensation delay having a duration which is adjustable through the choice of inexpensive and accurate internal components.

A further related object of the present invention is to provide an improved method for utilizing a Voltage Control Oscillator VCO control signal within a Write Precompensation Delay circuit of a PRML data channel of a disk drive.

The present invention provides data recovery in a sampled data channel and reduces the required range of a timing DAC so that a fine resolution adjustment may be provided without requiring a DAC having a large dynamic range. The present invention does not use circuitry associated with sample extraction and conditioning to enable a timing control system to lock to a frequency reference.

BRIEF DESCRIPTION OF THE DRAWINGS

The features of the present invention can be best understood together with further objectives and advantages by reference to the following description, taken in connection with the accompanying drawings, wherein like numerals indicate like parts.

FIG. 10 is an illustration of timing signals of the VCO shown in FIG. 7 and of the Write Precompensation Threshold circuit of FIG. 9, according to the present invention.

DETAILED DESCRIPTION OF THE INVENTION

A method and apparatus for write precompensation is described. In the following description, numerous specific details are set forth in order to provide a more thorough understanding of the present invention. It will be apparent, however, to one skilled in the art, that the present invention may be practiced without these specific details. In other instances, well-known features have not been described in detail in order not to unnecessarily obscure the present invention.

The following specification, taken in conjunction with the drawings, sets forth the preferred embodiment of the present invention. This embodiment is the best mode contemplated by the inventors for carrying out the invention, although it should be understood that various modifications can be accomplished within the parameters of the present invention.

Figure 1:
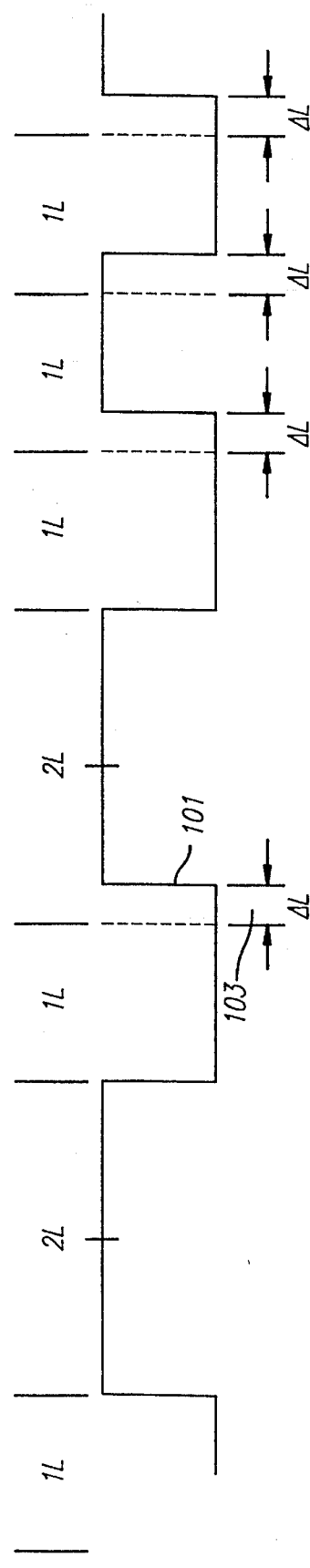
FIG. 1 is a graphical representation illustrating a write precompensated modulation waveform.
Figure 2:
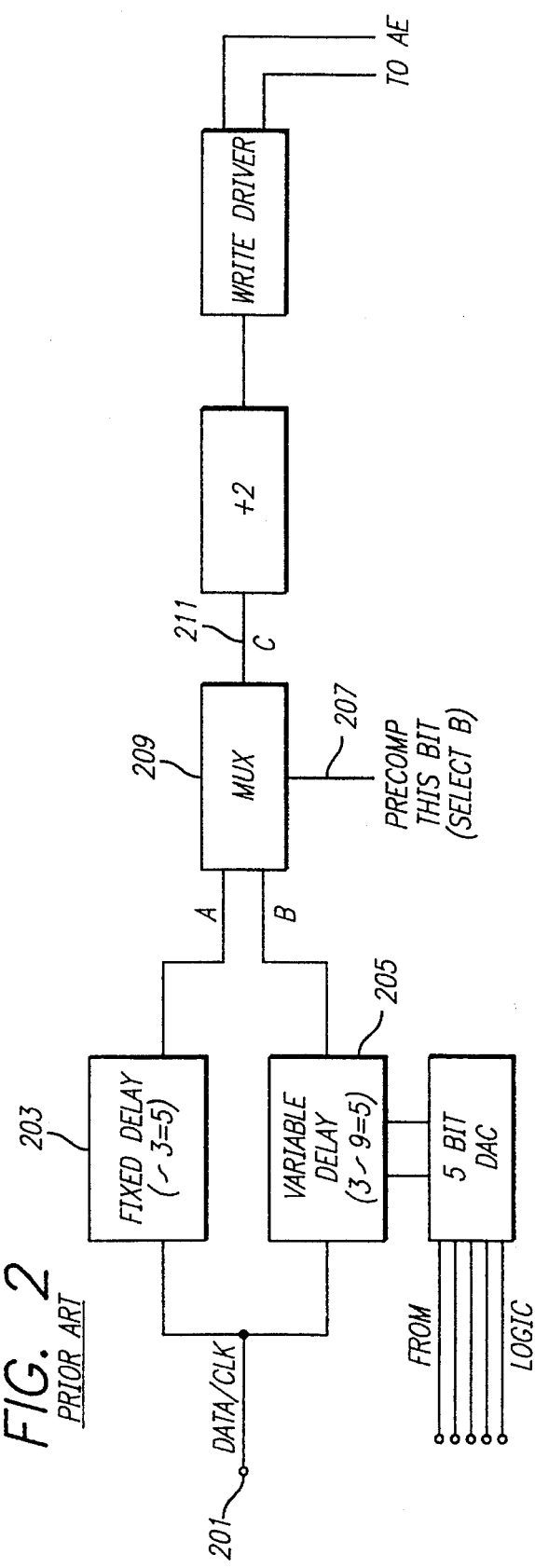
FIG. 2 is a simplified schematic diagram representation of a circuitry for write precompensation, used in the prior art magnetic disk apparatus.
Figure 3:
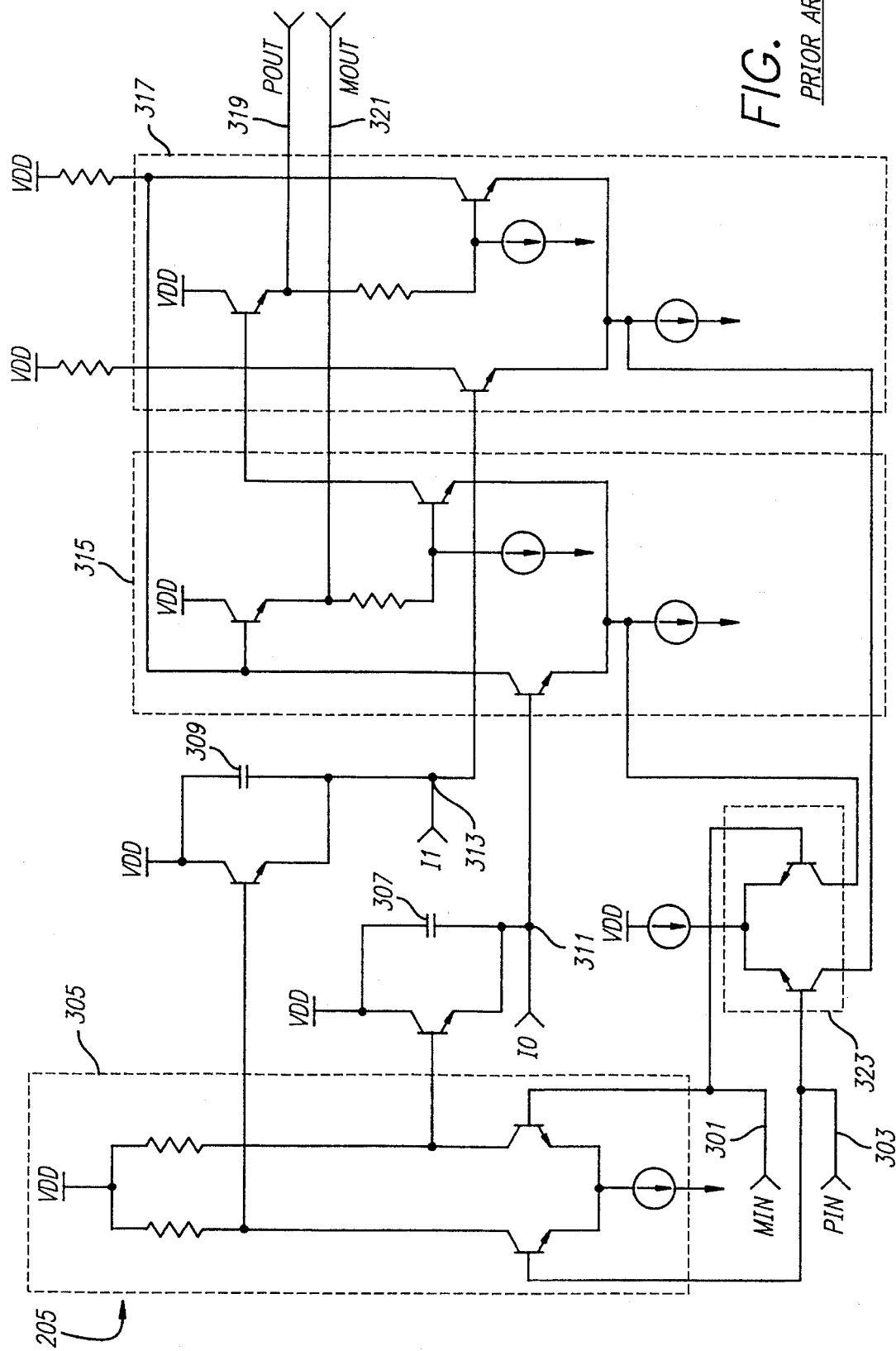
FIG. 3 is a schematic diagram representation of a variable delay circuitry for write precompensation, used in the prior art magnetic disk apparatus, shown in FIG. 2.
Figure 4:
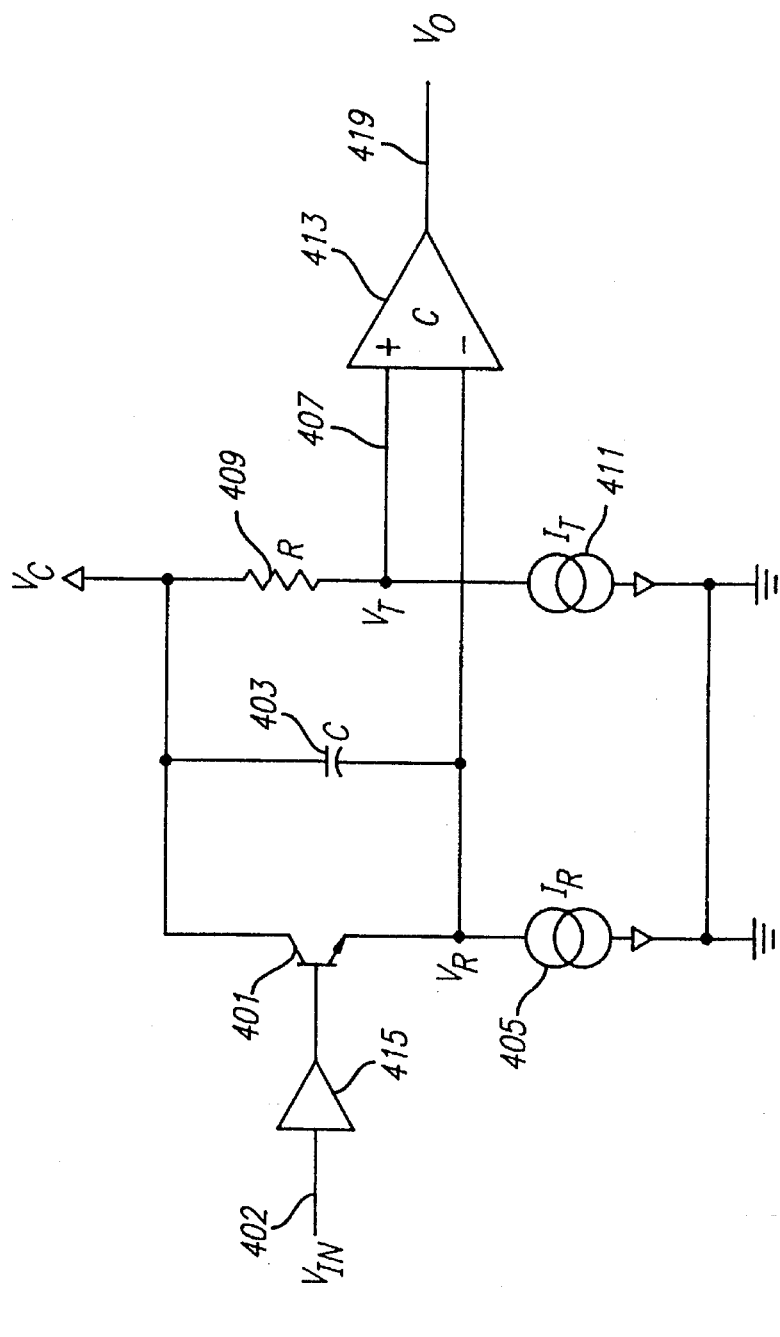
FIG. 4 is a schematic diagram representation of a sawtooth ramp variable delay circuitry, used in another prior art.
Figure 6:
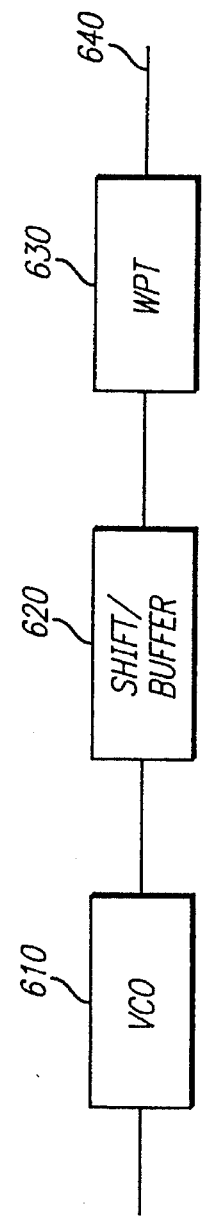
FIG. 6 is a high-level block diagram illustrating the circuitry for write precompensation, in accordance with the present invention.
Figure 5:
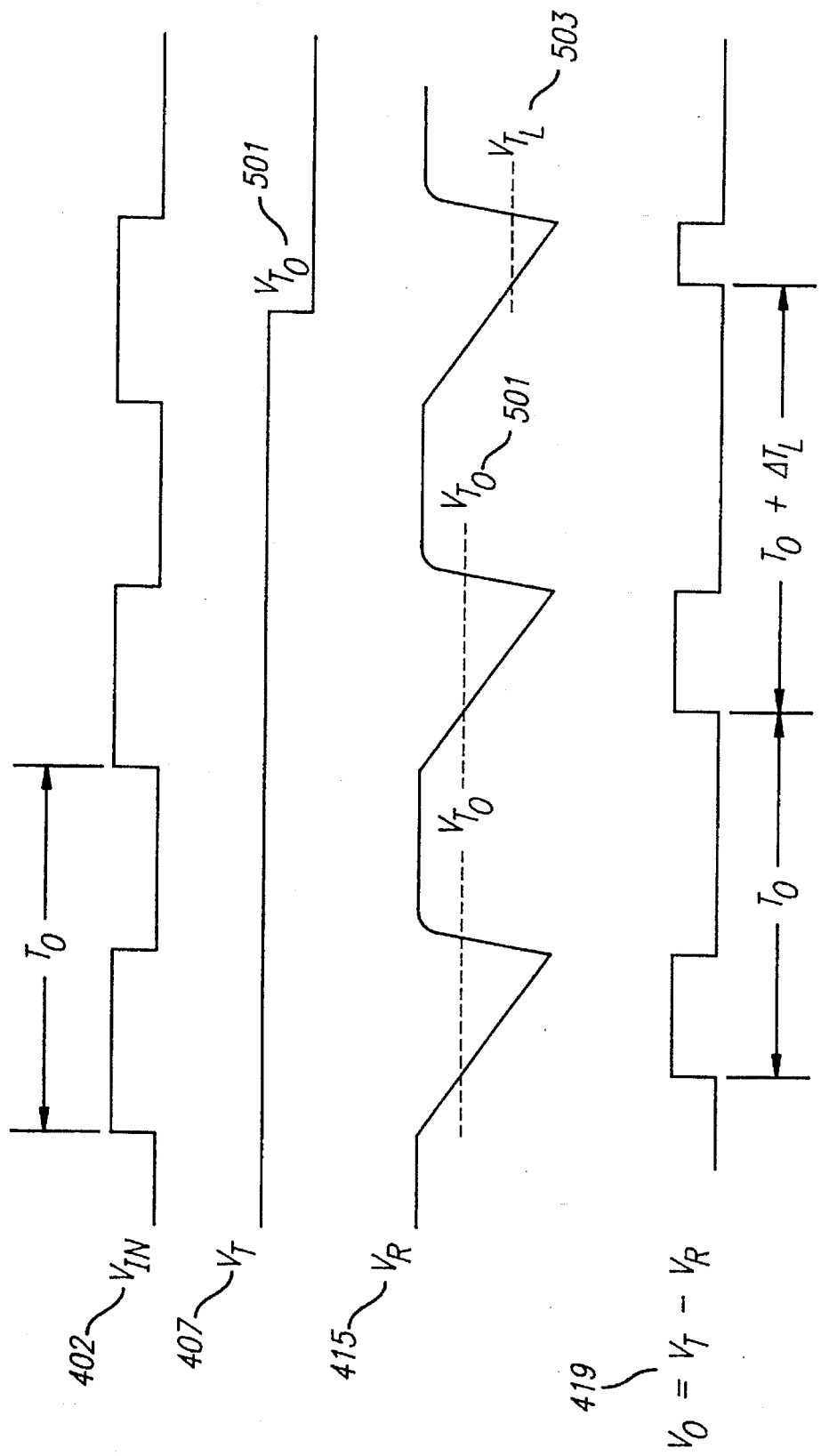
FIG. 5 is a timing diagram showing various signals pertaining to the prior art, shown in FIG. 4.

The present invention provides timing precompensation for a write data signal in a digital magnetic recording device. FIG. 6 is a block diagram of a Write Precompensation Delay circuit WPD using a Partial Response Maximum Likelihood (PRML) channel for writing digital data on the disk. In the preferred embodiment, the output timing signal from the emitter coupled Voltage Controlled Oscillator VCO 610, which is a reference timing circuit, is used to generate a write precompensation delay that is an accurate percentage of the VCO 610 period, equal to the write current time period. The VCO output is provided to a level shift/buffer circuit 620. The output of the level shift/buffer circuit 620 is provided to Write Precompensation Threshold (WPT) circuit 630. According to the invention, the data pulses and clock pulses are encoded by an encoder, not shown in any of the Figures, into a combined write signal. The precompensation circuit of the present invention has greater accuracy at lower cost than previous circuits. The invention achieves these and other advantages by transmitting all the signals which must be synchronized through the circuits constructed on the same chip to permit matching of component characteristics.

Figure 7:
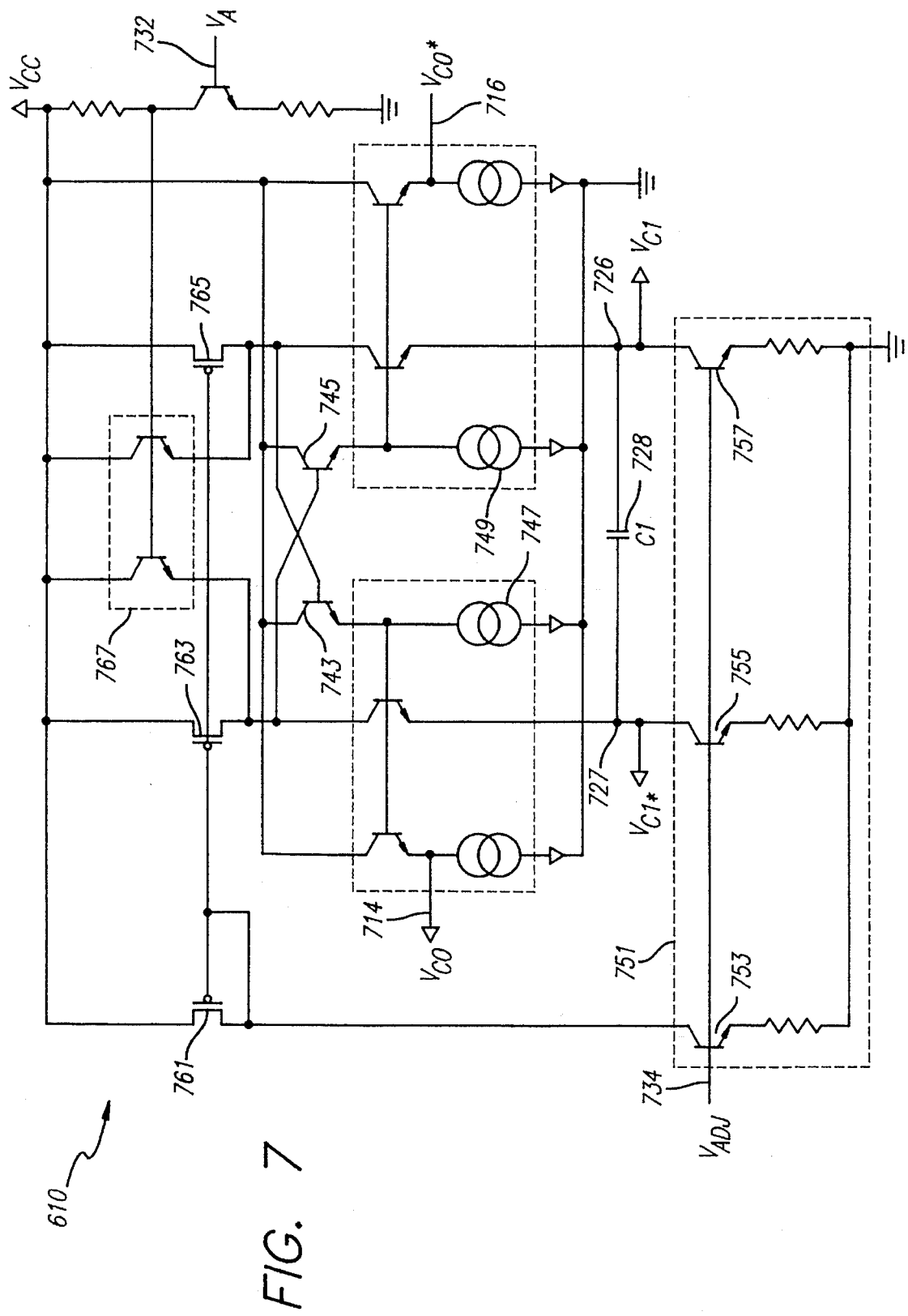
FIG. 7 is a more detailed diagram showing the implementation of the VCO circuit of FIG. 6, according to the present invention.

The emitter coupled VCO circuit 610 is shown in FIG. 7. Two transistors 743 and 745, have their emitters connected to two current sources 747 and 749. Their base voltage is regulated by three PMOS transistors 761, 763 and 765, connected to voltage clamp 767, regulated by voltage VA 732, described later. The oscillation frequency is set by the current source 751, consisting of transistors 753, 755 and 757, regulated by voltage VADJ 734. VCO-VCO* is a differential output (shown in FIG. 10) at nodes 714 and 716 of VCO circuit 610. The output timing signal 1018 is essentially a square wave signal operating at a frequency equal to the bit rate of the write data signal. Voltage VC1-VC1* is a differential ramp voltage (shown as waveform 1022 in FIG. 10) at nodes 726 and 727, across VCO 610 timing capacitor 728. VA 732, the input voltage for VCO 610, along with a load resistor, not shown, determines the amplitude of the ramp voltage 1022 VC1-VC1*. The frequency of the output timing signal 1018 from VCO circuit 610 can be varied for each zone and/or track on a magnetic storage disk by varying adjustable voltage VADJ 734, shown in FIG. 7. Zone selection is under the control of a disk file control microprocessor, not shown, which produces a digital code to appropriately configure the electronics for the particular zone.

Figure 8:
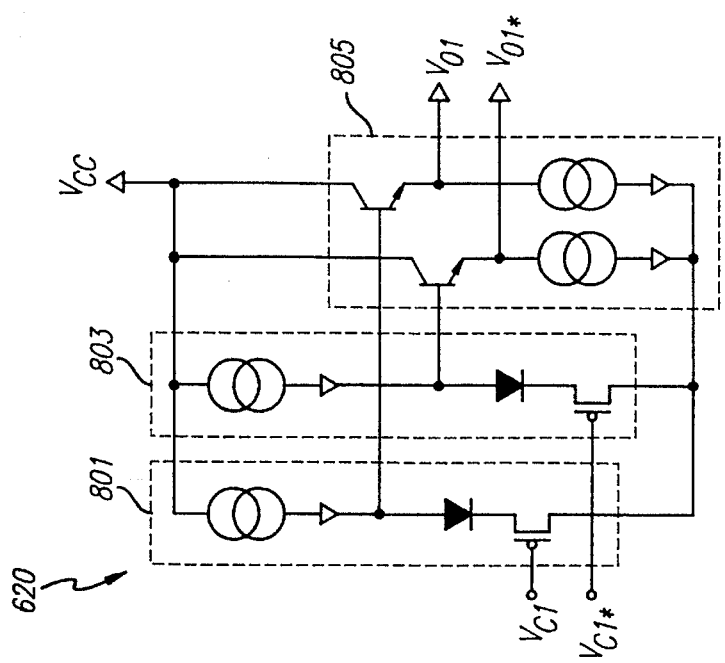
FIG. 8 is a more detailed diagram showing the implementation of the level shift/buffer circuit of FIG. 6, according to the present invention.
Figure 9:
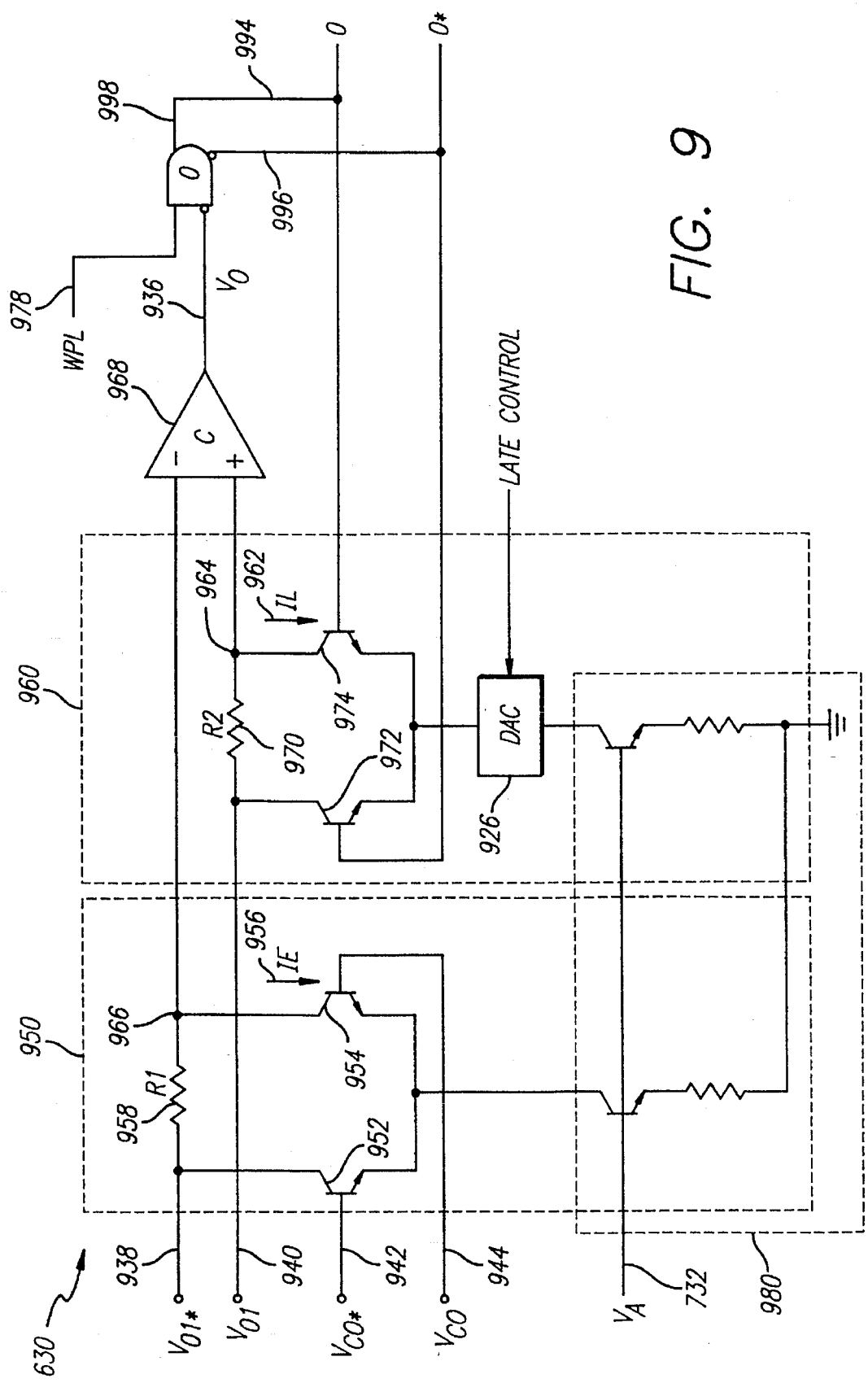
FIG. 9 is a more detailed diagram showing the implementation of the Write Precompensation Threshold circuit of FIG. 6, according to the present invention.

A level shift/buffer circuit 620, presented in FIG. 8, couples the differential ramp voltage 1022 VC1-VC1* across the timing capacitor C1 728, shown on FIG. 7, to a Write Precompensation Threshold circuit WPT 630, presented in FIG. 9. The level-shifted output of circuit 620 of FIG. 8 is shown as VO1-VO1* in FIGS. 8 and 9. Two diode-compensated voltage level shifters 801 and 803 are connected to the bases of an emitter follower 805, used to provide proper dc-level shift.

FIG. 9 is a schematic of one embodiment of a Write Precompensation Threshold circuit WPT 630, in accordance with the invention. The trailing edge of the write data signal is the edge to be delayed, since this edge ultimately causes the data latch, not shown, to pass the write data to disk write head, not shown. FIG. 10 shows timing waveforms for typical signals, taken at several points in WPT circuit 630, shown in FIG. 9. The time shift is illustrated as a dotted line representation of the time location on the timing diagrams. FIG. 10 illustrates phase drift of the transition pulses. VCO-VCO* differential output timing signal 1018 is a pulse sequence having waveform on FIG. 10. VC1-VC1* is the differential ramp voltage 1022. Write Precompensation Threshold WPT circuit 630 produces a comparator 968 output delayed data signal VO 936.

In the diagram of the programmable Write Precompensation Threshold circuit WPT 630 on FIG. 9, a first differential input is differential ramp voltage 1022 V01-V01*, at nodes 938 and 940. These signals were described previously as outputs from shift/buffer 620. A second differential input is differential output timing signal 1018 VCO*-VCO at nodes 942 and 944. According to the invention, the output timing signals VCO 714 and VCO* 716 are supplied to the Early Threshold circuit 950 on the bases of transistors 952 and 954, which provide a collector current signal Early Current IE 956. The transistors 952 and 954 have a common emitter, coupled to a constant current source 980, that keeps the voltage across resistor 958 constant, as required by the comparator 968.

The Late Threshold circuit 960 is programmed to optimize the delay by controlling the Late Current IL 962 and the Late Threshold Voltage VL 964 entering the comparator 968. Late threshold circuit 960 uses the same constant current source 980 that maintains the voltage across resistor 970 constant. Current flow 962 controlled by the current through transistors 972 and 974, controls the delay. FIG. 10 is an illustration of currents Early Current IE 956 and Late Current IL 962, as used in the WPT circuit 630, presented in FIG. 9. As is evident from the timing waveforms of the Write Precompensation Threshold circuit 630, shown in FIG. 10, Early Current IE 956 together with resistor R1 958, sets an Early Threshold Voltage VE 966. Late Current IL 962 and R2 970 set a Late Threshold Voltage VL 964.

Since the differential ramp voltage 1022 VC1-VC1* depends on the input voltage VA 732 (as previously described for VCO 610 circuit) and Early Current IE 956 and Late Current IL 962 are both determined by VA 732 (supplied on emitters of transistors 952, 954, 972 and 974 in Early and Late Threshold circuits 950 and 960) Early and Late Threshold Voltages VE 966 and VL 964 are accurate percentages of differential ramp voltage 1022 VC1-VC1*, since the resistors 958 and 970 are closely matched. Therefore, the late delay is an accurate percentage of the write current time period.

Additionally, the magnitude of the late delay is also controlled by a delay control code from DAC 926, described later, which sets the magnitude of Late Current 962. Threshold voltage crossings are detected by a comparator 968 which compares the Early Threshold Voltage 966 and Late Threshold Voltage 964 with differential ramp voltage 1022 VC1-VC1 *. By varying 964, the trailing edge delay can be varied since comparator 968 outputs 936 at the switching point where inputs cross or have zero differential voltage. Output voltage 936 enters an AND/NAND gate 998 with complementary outputs. The inputs of the AND/NAND gate are inverted comparator output 936 and a Write Precompensation Late enabling signal 978. The non-inverted output 994 and the inverted output 996 from the AND/NAND gate 998 are fed back to the bases of the transistors 972 and 974 in Late Threshold circuit 960. Thus, Late Current 962 raises when the rising edge of output voltage 936 goes down and vice versa. Signal 978, is a logic means for selecting between the delayed and undelayed write data signal. When high, it allows write precompensation by switching on Late Current 962 when the comparator's 968 output 936 is low and Early Current IE 956 is high, as shown in FIG. 10. The output of WPT 630 is the precompensated data signal, which is output to a hard disk interface, not shown.

Delay control code is a parallel digital signal from DAC 926 specifying the magnitude of the delay to be selectively applied to the write data signal. Although the optimum value of delay does not depend upon the write data sequence, it may vary with other factors, such as which of several different disk platters the data is to be written upon, bit spacing and which track of the disk is to receive the data. The amount of the delay can be any of several different values, depending upon the control code on DAC 926 parallel lines. The control code is produced by conventional means, not shown, for determining fire proper amount of pulse width change for the particular disk and track being written to. This signal changes orders of magnitude more slowly than the write data and clock signals, so that its delay is not critical for the purposes of the WPD circuit.

As will be described below, the write delay period is internally adjustable according to the ratio of two resistors 958 and 970 as a percentage of the write current time period. Once this percentage is set by the choice of the resistors 958 and 970, it remains a constant percentage independent of changes in the write current time period caused by a change in the clock frequency. This permits the data rate to be changed in real time, and the precompensation periods to be changed correspondingly, merely by changing the frequency of the clock signal. The choice of two internal resistors 958 and 970 adjusts the Early and Late Threshold voltage 966 and 964 of Early Threshold circuit 950 and Late Threshold circuit 960. If the frequency of the voltage control oscillator VCO is phase locked to a percentage of the write current frequency, then the choice of the two resistors 958 and 970 adjusts the precompensation delay period as a percentage of the write current time period.

Figure 11:
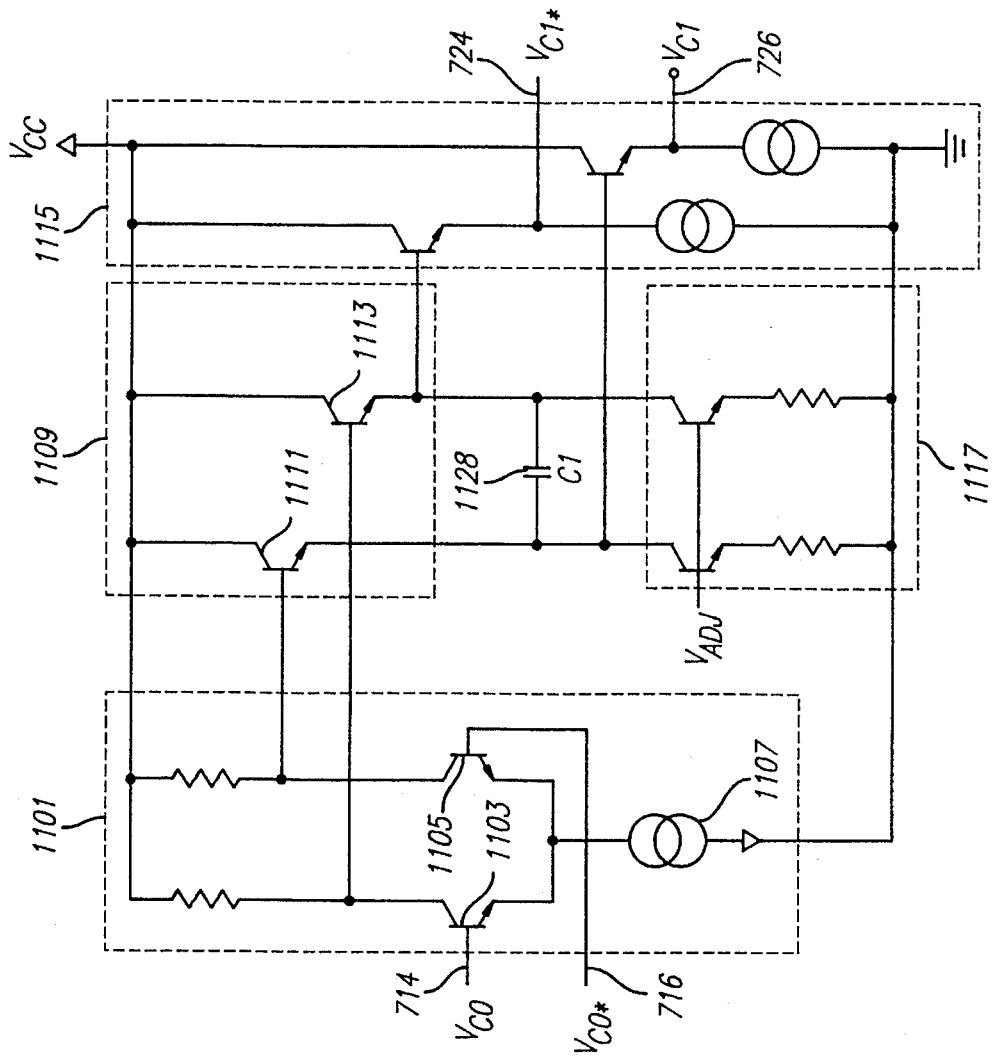
FIG. 11 is a more detailed diagram showing the implementation of the Ramp Generator, as employed in another embodiment of the present invention.

In another preferred embodiment, shown in FIG. 11, VCO's 610 differential ramp voltage 1022 VC1-VC1* is replicated in Ramp Generator circuit 1100, similar to the VCO's 610 timing circuit. According to FIG. 11, NPN differential amplifier 1101, consisting of transistors 1103 and 1105 and current source 1107 is connected to NPN emitter followers buffer 1109, consisting of transistors 1111 and 1113, driving the capacitor 1128 to produce a ramp voltage VC1*-VC1 1022, applied to the second pair of emitter followers buffer 1115. A current source 1117, with the same VADJ 734 on transistors' bases, regulates the ramp voltage VC1*-VC1 1022 characteristics. This circuit allows decoupling of Write Precompensation Delay circuit from VCO 610 circuit and simplifies the level shifting circuitry between the Ramp Generator 1100 and the Write Precompensation Threshold circuit 630.

The embodiments described are well suited for integration since the circuits' accuracy depends upon the easily achievable matching of resistor ratios and identical-geometry devices.

Although the invention has been described with reference to magnetic storage devices, the invention is also applicable to other forms of storage devices and their associated means of storing and retrieving information. For example, a storage device employing optical means for storing and/or retrieving information may be implemented with the novel features of this invention.

While the invention has been described with reference to a specific embodiments, the description is illustrative of the invention and is not to be construed as limiting the invention. Various modifications and applications may occur to those skilled in the art without departing from the true spirit and scope of the invention, as defined by the appended claims.

Thus, a method and apparatus for write precompensation has been described.

I claim:

1. A write precompensation delay generator circuit comprising:
    an early threshold circuit coupled to a first input voltage, said early threshold circuit outputting an early threshold voltage, said early threshold voltage being a percentage of said first input voltage;
    a late threshold circuit coupled to a second input voltage, said late threshold circuit outputting a late threshold voltage, said late threshold voltage being a percentage of said second input voltage;
    a comparator coupled to said early threshold voltage and said late threshold voltage, said comparator for identifying threshold voltage crossings and for providing an output delayed data signal;
    wherein said early threshold circuit includes a first resistor and said late threshold circuit includes a second resistor and wherein said output delayed data signal is dependent on a ratio between said first and second resistors.

2. The circuit of claim 1 wherein said percentage is a constant percentage.

3. The circuit of claim 1 wherein a current source supplies a current to said early threshold circuit and said late threshold circuit.

4. The circuit of claim 3 wherein said current, said first input voltage, and said second input voltage are proportional to a control voltage.

5. The circuit of claim 3 wherein a delay control code controls said current supplied to said late threshold circuit.

6. A write precompensation delay generator circuit comprising:
    a voltage controlled oscillator for producing a write current time period and differential ramp voltage, said differential ramp voltage providing first and second input signals;
    an early threshold circuit coupled to said first input signal, said early threshold circuit outputting a first output signal;
    a late threshold circuit coupled to said second input signal, said late threshold circuit outputting a second output signal;
    a comparator coupled to said first output signal and said second output signal, said comparator for identifying threshold voltage crossings and for providing an output delayed data signal.

7. The circuit of claim 6 wherein said early threshold circuit, said late threshold circuit, and said voltage controlled oscillator are controlled by a common input signal.

8. A write precompensation delay generator circuit comprising:
    an early threshold circuit coupled to a first input signal, said early threshold circuit outputting a first output signal;
    a late threshold circuit coupled to a second input signal, said late threshold circuit outputting a second output signal;
    a comparator coupled to said first output signal and said second output signal, said comparator for identifying threshold voltage crossings and for providing an output delayed data signal;
    wherein said early threshold circuit includes a first resistor and said late threshold circuit includes a second resistor and wherein said output delayed data signal is dependent a ratio between said first and second resistors.

9. A write precompensation delay generator circuit comprising:

an early threshold circuit coupled to a first input signal, said early threshold circuit outputting a first output signal;

a late threshold circuit coupled to a second input signal, said late threshold circuit outputting a second output signal;

a comparator coupled to said first output signal and said second output signal, said comparator for identifying threshold voltage crossings and for providing an output delayed data signal;

wherein said late threshold circuit is enabled in response to a write precompensation late enabling signal.

10. A write precompensation delay generator circuit comprising:

an early threshold circuit coupled to a first input voltage, said early threshold circuit outputting an early threshold voltage, said early threshold voltage being a percentage of said first input voltage;

a late threshold circuit coupled to a second input voltage, said late threshold circuit outputting a late threshold voltage, said late threshold voltage being a percentage of said second input voltage;

a comparator coupled to said early threshold voltage and said late threshold voltage, said comparator for identifying threshold voltage crossings and for providing an output delayed data signal;

a voltage controlled oscillator for producing a write current time period and differential ramp voltage.

11. The circuit of claim 10 wherein said early threshold circuit, said late threshold circuit, and said voltage controlled oscillator are controlled by a common input signal.

12. A write precompensation delay generator circuit comprising:

an early threshold circuit coupled to a first input voltage, said early threshold circuit outputting an early threshold voltage, said early threshold voltage being a percentage of said first input voltage;

a late threshold circuit coupled to a second input voltage, said late threshold circuit outputting a late threshold voltage, said late threshold voltage being a percentage of said second input voltage;

a comparator coupled to said early threshold voltage and said late threshold voltage, said comparator for identifying threshold voltage crossings and for providing an output delayed data signal;

wherein said early threshold circuit includes a first resistor and said late threshold circuit includes a second resistor and wherein said output delayed data signal is dependent on a ratio between said first and second resistors.

13. A write precompensation delay generator circuit comprising:

an early threshold circuit coupled to a first input voltage, said early threshold circuit outputting an early threshold voltage, said early threshold voltage being a percentage of said first input voltage;

a late threshold circuit coupled to a second input voltage, said late threshold circuit outputting a late threshold voltage, said late threshold voltage being a percentage of said second input voltage;

a comparator coupled to said early threshold voltage and said late threshold voltage, said comparator for identifying threshold voltage crossings and for providing an output delayed data signal;

wherein said late threshold circuit is enabled in response to a write precompensation late enabling signal.

14. A write precompensation delay generator circuit comprising:

an early threshold circuit coupled to a first input voltage, said early threshold circuit outputting an early threshold voltage, said early threshold voltage being a percentage of said first input voltage;

a late threshold circuit coupled to a second input voltage, said late threshold circuit outputting a late threshold voltage, said late threshold voltage being a percentage of said second input voltage;

a comparator coupled to said early threshold voltage and said late threshold voltage, said comparator for identifying threshold voltage crossings and for providing an output delayed data signal;

wherein said percentage is a constant percentage.

15. A write precompensation delay generator circuit comprising:

an early threshold circuit coupled to a first input voltage, said early threshold circuit outputting an early threshold voltage, said early threshold voltage being a percentage of said first input voltage;

a late threshold circuit coupled to a second input voltage, said late threshold circuit outputting a late threshold voltage, said late threshold voltage being a percentage of said second input voltage;

a comparator coupled to said early threshold voltage and said late threshold voltage, said comparator for identifying threshold voltage crossings and for providing an output delayed data signal;

wherein a current source supplies a current to said early threshold circuit and to said late threshold circuit.

16. The circuit of clam 15 wherein said current, said first input voltage, and said second input voltage are proportional to a control voltage.

17. The circuit of claim 15 wherein a delay control code controlled said current supplied to said late threshold circuit.

* * * * *